(12) United States Patent
Miyamoto et al.

(10) Patent No.: US 11,094,871 B2
(45) Date of Patent: Aug. 17, 2021

(54) LIGHT-EMITTING DEVICE, LIGHT-EMITTING MODULE AND METHOD FOR MANUFACTURING THE SAME

(71) Applicant: NICHIA CORPORATION, Anan (JP)

(72) Inventors: Kimihiro Miyamoto, Tokushima (JP); Tomoyuki Sato, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/816,435

(22) Filed: Mar. 12, 2020

(65) Prior Publication Data

US 2020/0295246 A1 Sep. 17, 2020

(30) Foreign Application Priority Data

Mar. 13, 2019 (JP) .............................. JP2019-045504

(51) Int. Cl.
*H01L 33/64* (2010.01)
*H01L 33/62* (2010.01)

(52) U.S. Cl.
CPC ............ *H01L 33/642* (2013.01); *H01L 33/62* (2013.01); *H01L 33/647* (2013.01); *H01L 2933/0075* (2013.01)

(58) Field of Classification Search
CPC combination set(s) only.
See application file for complete search history.

(56) References Cited

U.S. PATENT DOCUMENTS

| 2007/0057364 A1* | 3/2007 | Wang | H01L 33/642 257/701 |
| 2013/0215613 A1* | 8/2013 | Wu | F21K 9/20 362/249.02 |
| 2013/0258658 A1* | 10/2013 | Hussell | H01L 25/0753 362/235 |

FOREIGN PATENT DOCUMENTS

JP 2016-96190 A 5/2016

* cited by examiner

*Primary Examiner* — Ratisha Mehta
(74) *Attorney, Agent, or Firm* — Birch, Stewart, Kolasch & Birch, LLP

(57) ABSTRACT

A light-emitting module 1 includes a light-emitting element, a mounting board, a module board, an anode connection member, a cathode connection member, and a metal ribbon. The light-emitting element includes an anode electrode and a cathode electrode. The mounting board includes an anode pad, a cathode pad and a heat radiating pads, each of which is electrically independent. The anode electrode and the anode pad are connected. The cathode electrode and the cathode pad are connected. The module board includes an anode terminal, a cathode terminal and a heat sink. The anode connection member connects the anode pad and the anode terminal. The cathode connection member connects the cathode pad and the cathode terminal. The metal ribbon connects the heat radiating pads and the heat sink.

7 Claims, 10 Drawing Sheets

LIGHT-EMITTING DEVICE, LIGHT-EMITTING MODULE AND METHOD FOR MANUFACTURING THE SAME

CROSS-REFERENCE TO RELATED APPLICATIONS

This application is based upon and claims the benefit of priority from Japanese Patent Application No. 2019-045504, filed on Mar. 13, 2019; the entire contents of which are incorporated herein by reference.

FIELD

Embodiments described herein relate generally to a light-emitting device, a light-emitting module and a method for manufacturing the same.

BACKGROUND

In recent years, higher output of a light-emitting device using a light-emitting diode (LED) has been achieved, and accordingly, improvement in heat dissipation is desired. JP 2016-96190 A (Kokai) has disclosed a technique in which a semiconductor element is connected to a heat sink via a through interconnect provided in an interconnect board, and the heat of the semiconductor element is discharged using a current path from the semiconductor element to the heat sink. However, further improvement in heat dissipation is required for the light-emitting device.

SUMMARY

According to one embodiment, a light-emitting device includes a light-emitting element, and a mounting board. The light-emitting element includes an anode electrode and a cathode electrode. The mounting board includes an anode pad, a cathode pad and a heat radiating pad, each of which is electrically independent. The anode electrode and the anode pad are connected, and the cathode electrode and the cathode pad are connected.

According to one embodiment, a light-emitting module includes a light-emitting element, a mounting board, a module board, an anode connection member, a cathode connection member, and a metal ribbon. The light-emitting element includes an anode electrode and a cathode electrode. The mounting board includes an anode pad, a cathode pad and a heat radiating pad, each of which is electrically independent. The anode electrode and the anode pad are connected. The cathode electrode and the cathode pad are connected. The module board includes an anode terminal, a cathode terminal and a heat sink. The anode connection member connects the anode pad and the anode terminal. The cathode connection member connects the cathode pad and the cathode terminal. The metal ribbon connects the heat radiating pad and the heat sink.

According to one embodiment, a method for manufacturing a light-emitting module is disclosed. The method can include preparing a light-emitting device. The light-emitting device includes a light-emitting element including an anode electrode and a cathode electrode, and a mounting board. The mounting board includes an anode pad, a cathode pad and a heat radiating pad, each of which is electrically independent. The anode electrode and the anode pad are connected. The cathode electrode and the cathode pad are connected. The method can include mounting the light-emitting device on a module board including an anode terminal, a cathode terminal, and a heat sink. The method can include connecting an anode connection member to the anode pad and the anode terminal, and connecting a cathode connection member to the cathode pad and the cathode terminal. In addition, the method can include connecting a metal ribbon to the heat radiating pad and the heat sink.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION

Figure 1A:
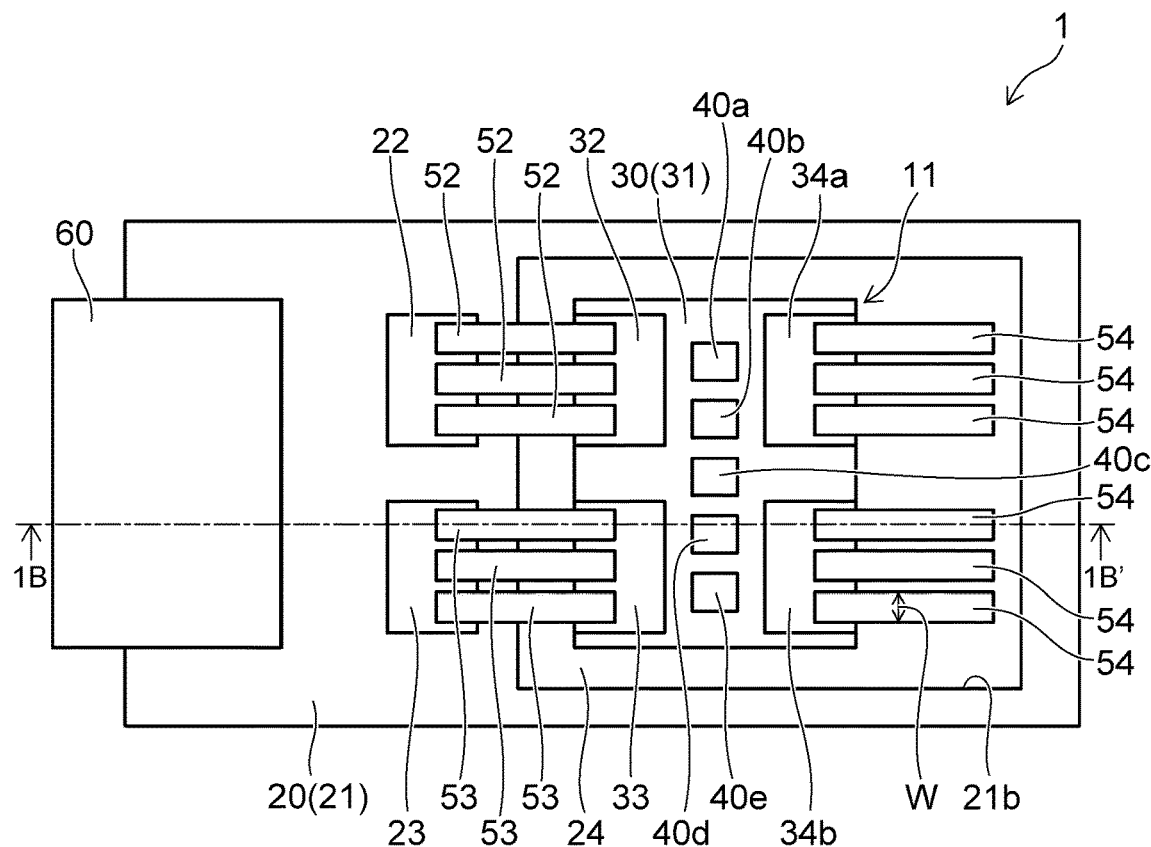
FIG. 1A is a plan view showing a light-emitting module according to a first embodiment.

Embodiments of the invention will now be described with reference to the accompanying drawings, wherein like reference numerals designate corresponding or identical elements throughout the various drawings. However, the below mentioned embodiments are intended to illustrate exemplary light emitting devices for implementing the technical concept of the present invention, and are not intended to limit elements recited in the scope of claims to those described in the embodiments. A size, a material, and a shape of the constituent members, and a relative positioning therebetween exemplified in the embodiments are not intended to limit the scope of the present invention. The size and the positional relationship of the members illustrated in each drawing may be enlarged for the sake of clear explanation. Further, in the following description, the same titles and the same reference numbers and/or symbols indicate the same or the equivalent members and thus detailed descriptions of them are omitted.

First Embodiment

First, the first embodiment will be described.

FIG. 1A is a plan view showing a light-emitting module according to a first embodiment.

Figure 1B:
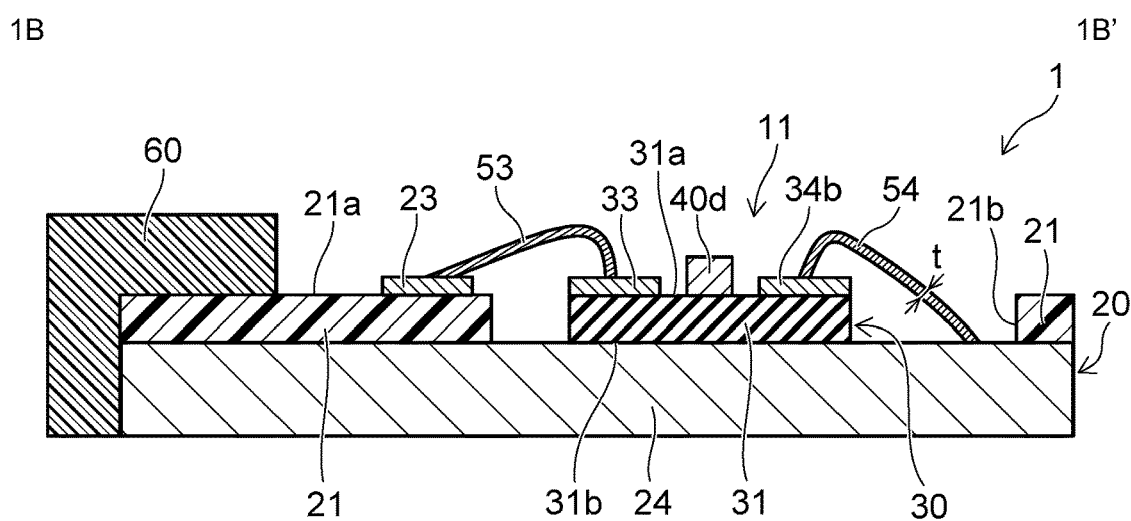
FIG. 1B is an end view taken along 1B-1B' line shown in FIG. 1A.

FIG. 1B is an end view along 1B-1B' line shown in FIG. 1A.

Figure 2:
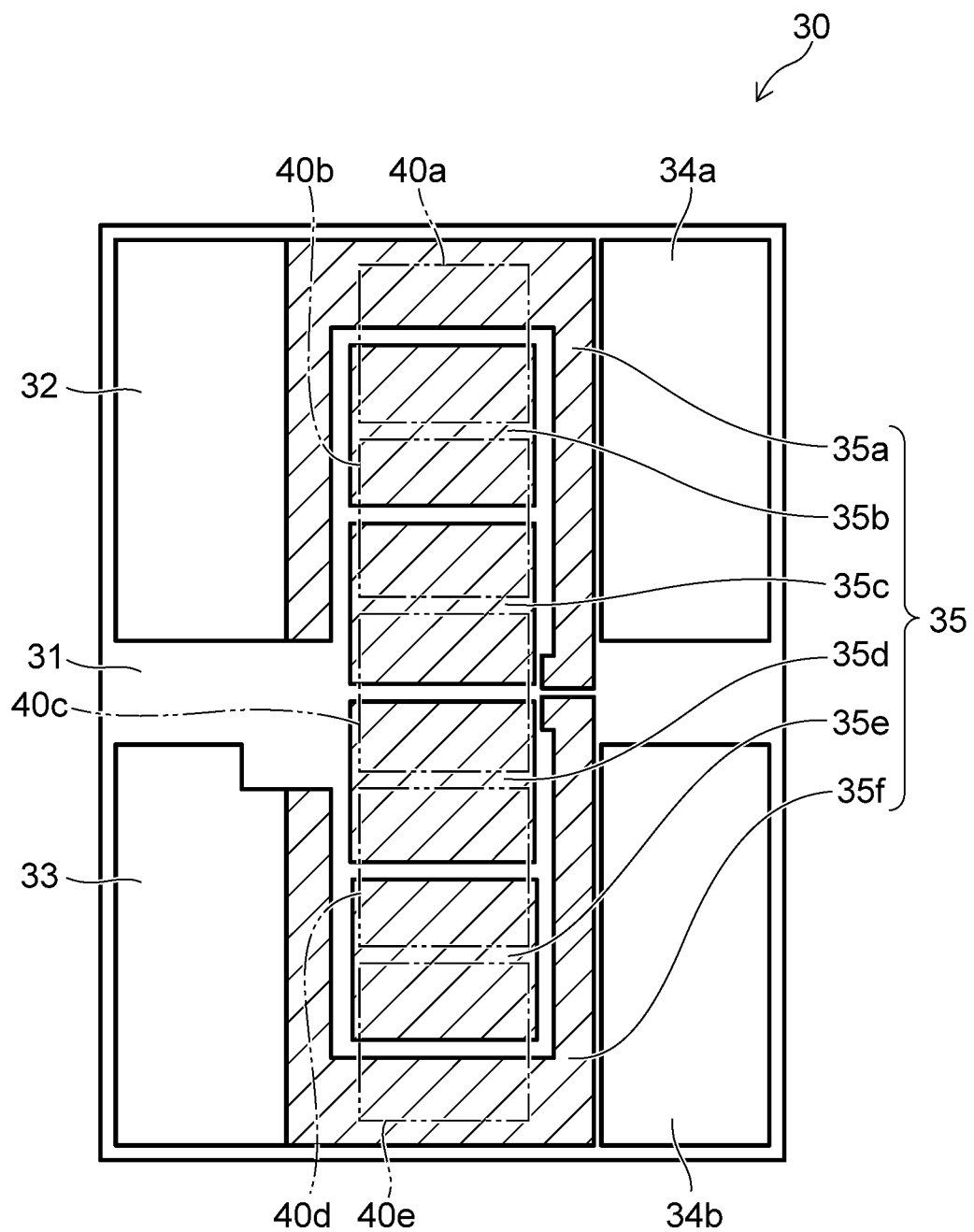
FIG. 2 is a plan view showing a mounting board of a light-emitting device according to the first embodiment.

FIG. 2 is a plan view showing a mounting board of a light-emitting device according to the first embodiment.

The light-emitting module 1 according to the embodiment includes a light-emitting element 40 including an anode electrode and a cathode electrode; a mounting board 30 including an anode pad 32, a cathode pad 33 and heat radiating pads 34a and 34b each of which are electrically independent, the anode electrode and the anode pad 32 being connected, the cathode electrode and the cathode pad 33 being connected; a module board including an anode terminal 22, a cathode terminal 23 and a heat sink 24; an anode connection member 52 connecting the anode pad 32 and the anode terminal 22; a cathode connection member 53 connecting the cathode pad 33 and the cathode terminal 23; and metal ribbons 54 connecting the heat radiating pads 34a and 34b to the heat sink 24. The light-emitting element 40 and the mounting board 30 configure the light-emitting device 11 according to the embodiment.

This will be described in more detail below.

As shown in FIG. 1A, FIG. 1B, FIG. 2, the light-emitting module 1 is provided with the module board 20. The module board 20 is provided with the heat sink 24. The heat sink 24 is a board made of a metal material such as copper, for example. An insulating portion 21 is provided on the heat sink 24. In the insulating portion 21, for example, wiring is provided in a parent material made of an insulative resin material. The anode terminal 22 and the cathode terminal 23 are provided on the upper surface 21a of the insulating portion 21. The anode terminal 22 and the cathode terminal 23 are, for example, metal plates and are isolated from each other. Moreover, an opening 21b is formed in the insulating portion 21, and the heat sink 24 is exposed in the opening 21b.

On the module board 20, the light-emitting device 11 is provided. The light-emitting device 11 is disposed in the opening 21b of the insulating portion 21. The light emitting device 11 is provided with the mounting board 30 and, for example, five light-emitting elements 40a to 40e (generally referred to as "light-emitting element 40"). The number of the light-emitting elements 40 is not limited to five, but may be 1 to 4, or 6 or more.

The mounting board 30 is provided with, for example, a base material 31 made of aluminum nitride (AlN). The lower surface 31b of the base material 31 is in contact with the upper surface of the heat sink 24. On the upper surface 31a of the base material 31, for example, one anode pad 32, for example, one cathode pad 33, and, for example, two heat radiating pads 34a and 34b are provided. The anode pad 32, the cathode pad 33, and the heat radiating pads 34a and 34b are isolated from each other and are electrically independent from each other. One anode pad 32, one cathode pad 33, and two heat radiating pads 34a and 34b are arranged in two rows and two columns. The anode pad 32 and the cathode pad 33 are disposed adjacent to each other, and the heat radiating pad 34a and the heat radiating pad 34b are disposed adjacent to each other.

An interconnect pattern 35 is provided on the upper surface 31a of the base material 31 between the anode pad 32 and the heat radiating pad 34a, and between the cathode pad 33 and the heat radiating pad 34b. The interconnect pattern 35 is divided into six portions 35a to 35f. The portion 35a of the interconnect pattern 35 is electrically connected to the anode pad 32, and the portion 35f is electrically connected to the cathode pad 33. The heat radiating pads 34a and 34b are insulated from all of the portions 35a to 35f of the interconnect pattern 35.

The light-emitting elements 40a to 40e are mounted on the interconnect pattern 35. The light-emitting element 40 is, for example, a light emitting diode (LED). Each light-emitting element 40 is provided with the anode electrode and the cathode electrode. The anode electrode of the light-emitting element 40a is connected to the portion 35a of the interconnect pattern 35, and the cathode electrode is connected to the portion 35b. The anode electrode of the light-emitting element 40b is connected to the portion 35b, and the cathode electrode is connected to the portion 35c. The anode electrode of the light-emitting element 40c is connected to the portion 35c, and the cathode electrode is connected to the portion 35d. The anode electrode of the light-emitting element 40d is connected to the portion 35d, and the cathode electrode is connected to the portion 35e. The anode electrode of the light-emitting element 40e is connected to the portion 35e, and the cathode electrode is connected to the portion 35f.

Thereby, the light-emitting elements 40a to 40e are connected in series between the anode pad 32 and the cathode pad 33 via the interconnect pattern 35. That is, the anode electrode of each light-emitting element 40 is connected to the anode pad 32, and the cathode electrode of each light-emitting element 40 is connected to the cathode pad 33.

The light-emitting module 1 is provided with one or a plurality of anode connection members 52. The anode connection members 52 connect the anode pad 32 of the mounting board 30 and the anode terminal 22 of the module board 20. In the example shown in FIG. 1A, the anode connection members 52 are metal ribbons, for example, three ribbons are provided and are arranged in parallel one another.

The light-emitting module 1 is provided with one or a plurality of cathode connection members 53. The cathode connection members 53 connect the cathode pad 33 of the mounting board 30 and the cathode terminal 23 of the module board 20. In the example shown in FIG. 1A, the cathode connection members 53 are metal ribbons, for example, three ribbons are provided and are arranged in parallel one another.

The light-emitting module 1 is provided with metal ribbons 54. In the example shown in FIG. 1A, for example, six metal ribbons 54 are provided and arranged in parallel one another. The three metal ribbons 54 connect the heat radiating pad 34a of the mounting board 30 and the heat sink 24 of the module board 20, and the other three metal ribbons 54 connect the heat radiating pad 34b and the heat sink 24. As will be described later, the number of metal ribbons 54 is not limited to six.

The metal ribbon 54 is made of a metal material having high thermal conductivity such as aluminum or copper. The thermal conductivity of the metal ribbon 54 is, for example, not less than 200 W/m·K and not more than 430 W/m·K. Thereby, manufacturing cost can be held down with achieving high heat dissipation. The metal ribbon 54 is a strip-shaped conductive member having a width larger than the thickness. For example, the width W of the metal ribbon 54 is not less than 2 times and not more than 20 times the thickness t of the metal ribbon 54. The heat radiation area can be increased by making the width W of the metal ribbon 54 larger than the thickness t. In one example, the width W of the metal ribbon 54 is 0.75 mm and the thickness t is 0.1 mm. Moreover, the length of the metal ribbon 54 is 1.0 mm or more and 4.0 mm or less, for example. Thereby, high heat dissipation can be realized with suppressing the fracture etc. of the metal ribbon 54. The metal ribbon 54 may be curved so as to be convex upward. By bending the metal ribbon 54, the connection can be made easily. The material and dimensions of the metal ribbon used for the anode connection member 52 and the cathode connection member 53 are also the same as the metal ribbon 54, for example.

The light-emitting module 1 is provided with a connector 60. The connector 60 is connected to the module board 20. The connector 60 is provided with at least a pair of external terminals, and each external terminal is connected to the anode terminal 22 and the cathode terminal 23 via the interconnect in the insulating portion 21 of the module board 20.

The light-emitting module 1 may be thermally connected to an external heat sink. In this case, the lower surface of the module board 20, that is, the lower surface of the heat sink 24 is in contact with the external heat sink.

Next, a method for manufacturing the light-emitting module 1 according to the embodiment is described.

FIG. 3A to FIG. 3E are plan views showing a method for manufacturing the light-emitting module 1 according to the embodiment.

(Process of Preparing the Light-Emitting Device 11)

Figure 3A:
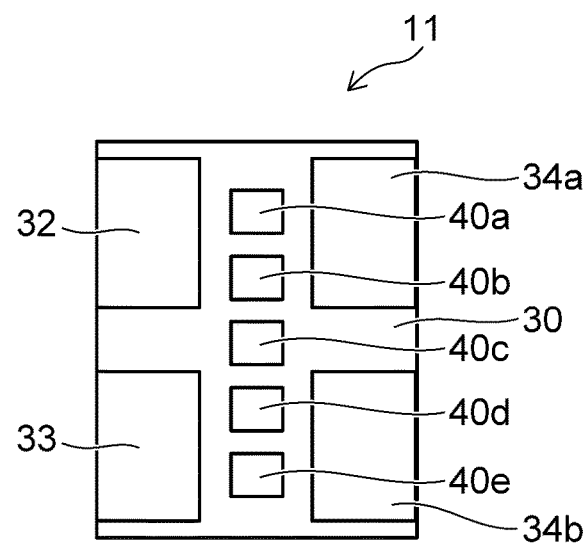
FIGS. 3A-3E are plan views showing a method for manufacturing the light-emitting module according to the first embodiment.

First, as shown in FIG. 3A, the light-emitting device 11 is prepared. The light-emitting device 11 is provided with the light-emitting elements 40a to 40e and the mounting board 30. Each light-emitting element 40 includes the anode electrode and the cathode electrode. The mounting board 30 includes a base material 31, the anode pad 32, the cathode pad 33, and the heat radiating pads 34a and 34b. The anode pad 32, the cathode pad 33, and the heat radiating pads 34a and 34b are electrically independent from each other. The anode electrode and the anode pad 32 of each light-emitting element 40 are connected via the interconnect pattern 35, and the cathode electrode and the cathode pad 33 of the light-emitting element 40 are connected via the interconnect pattern 35.

(Process of Mounting the Light-Emitting Device 11 on the Module Board 20)

Figure 3B:
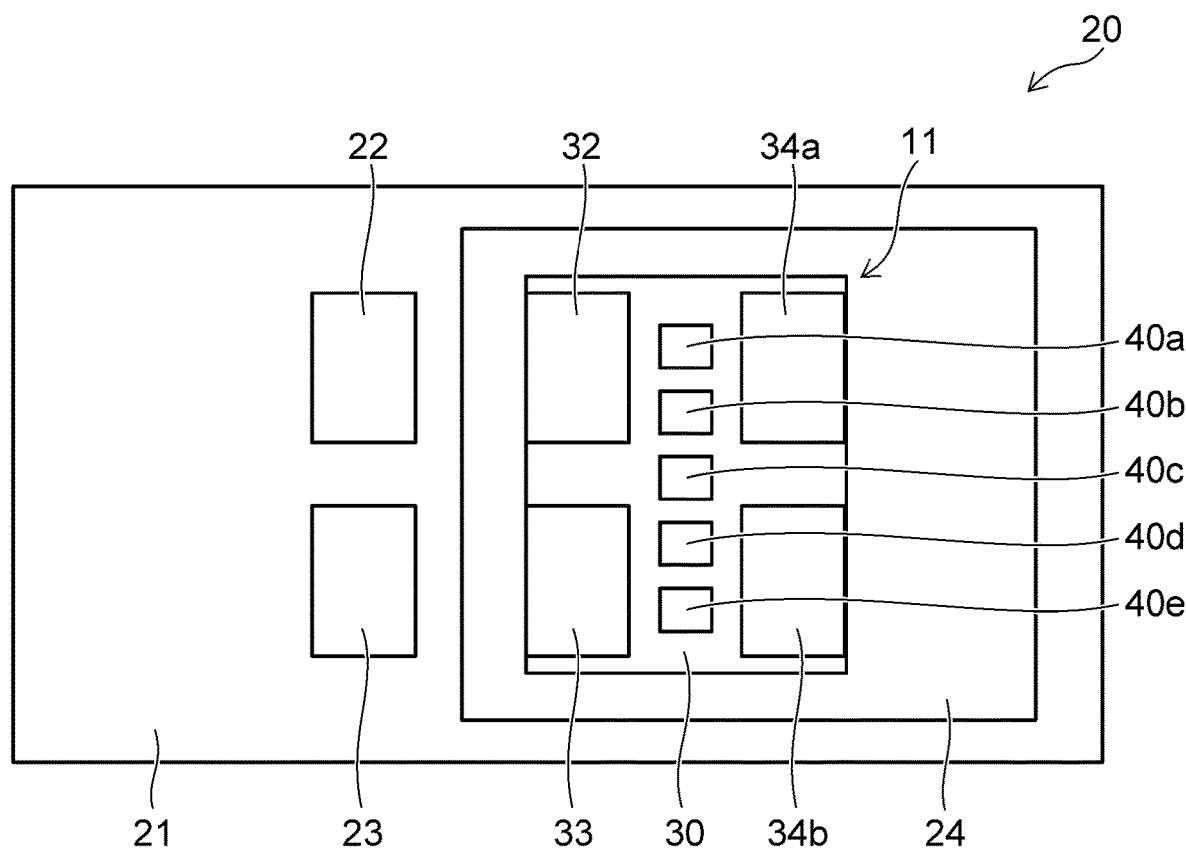

Next, as shown in FIG. 3B, the module board 20 is prepared. The module board 20 is provided with the insulating portion 21, the anode terminal 22, the cathode terminal 23, and the heat sink 24. Then, the light-emitting device 11 is mounted on the module board 20. The light-emitting device 11 is disposed on the heat sink 24 exposed in the opening 21b of the insulating portion 21. Thereby, the base material 31 contacts the heat sink 24.

(Process of Connecting the Anode Connection Member 52)

Figure 3C:
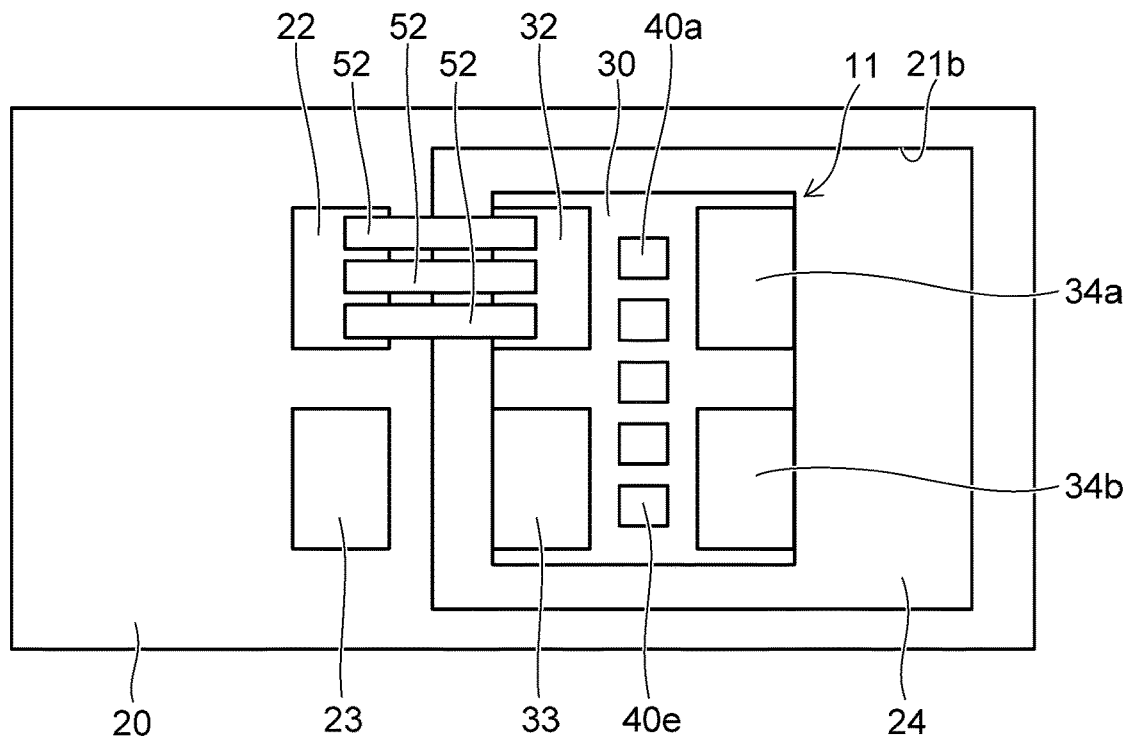

Next, as shown in FIG. 3C, one end of the anode connection member 52 is connected to the anode pad 32 of the mounting board 30, and the other end of the anode connection member 52 is connected to the anode terminal 22 of the module board 20. The anode connection member 52 may be connected to the anode terminal 22 after being connected to the anode pad 32, or may be connected to the anode pad 32 after being connected to the anode terminal 22.

(Process of Connecting the Cathode Connection Member 53)

Figure 3D:
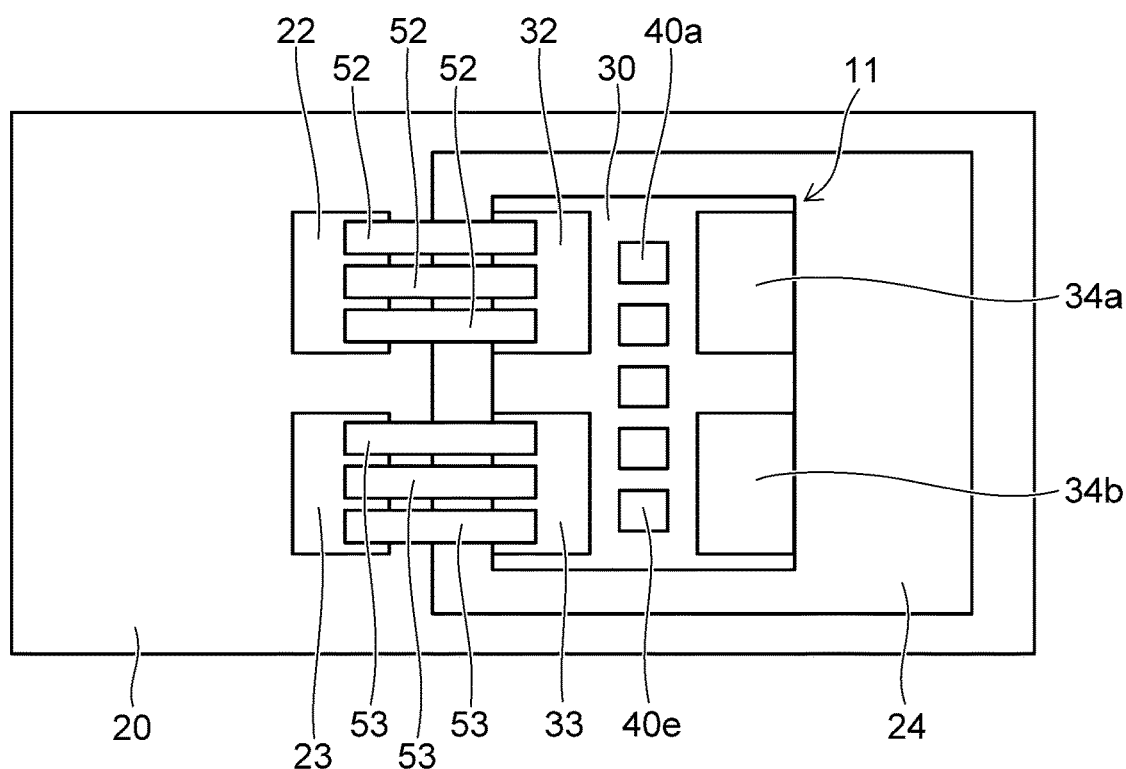

Also, as shown in FIG. 3D, one end of the cathode connection member 53 is connected to the cathode pad 33 of the mounting board 30, and the other end of the cathode connection member 53 is connected to the cathode terminal 23 of the module board 20. The cathode connection member 53 may be connected to the cathode terminal 23 after being connected to the cathode pad 33, or may be connected to the cathode pad 33 after being connected to the cathode terminal 23.

(Process of Connecting the Metal Ribbon 54)

Figure 3E:
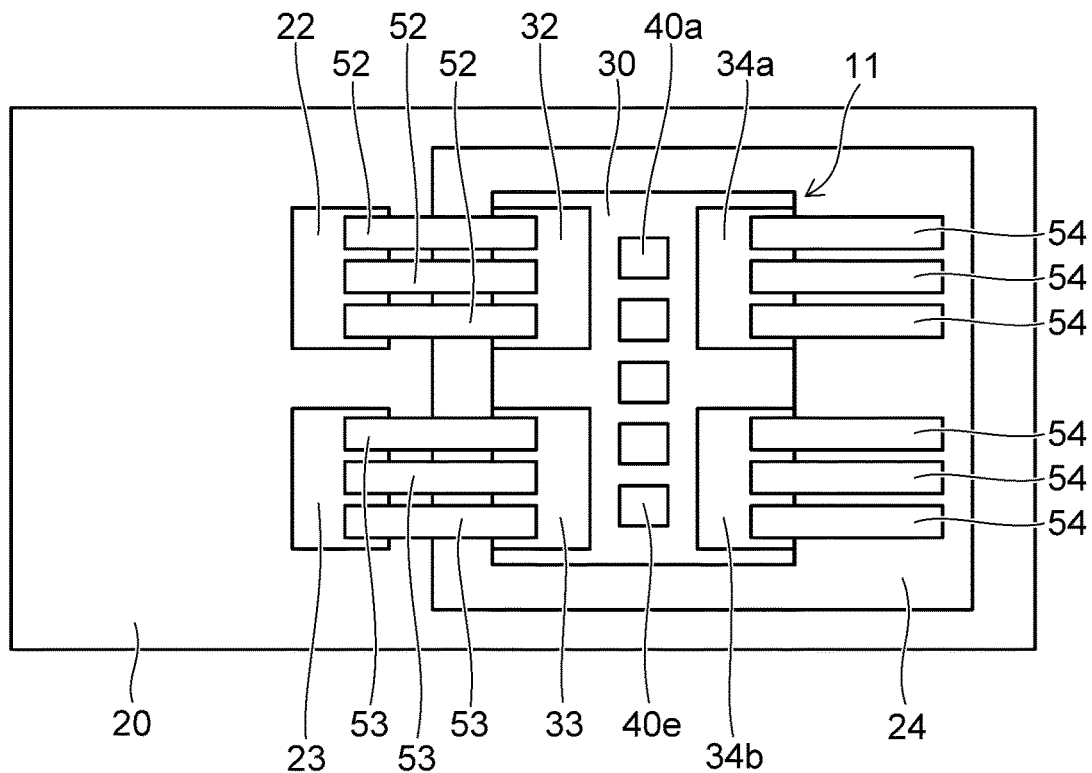

Further, as shown in FIG. 3E, one end of the metal ribbon 54 is connected to the heat radiating pad 34a or 34b of the mounting board 30, and the other end of the metal ribbon 54 is connected to the heat sink 24 of the module board 20. The metal ribbon 54 may be connected to the heat sink 24 after being connected to the heat radiating pad 34a or 34b, or may be connected to the heat radiating pad 34a or 34b after being connected to the heat sink 24.

Thereafter, the connector 60 is connected to the module board 20. In this way, the light-emitting module 1 according to the embodiment is manufactured. The order of the process of connecting the anode connection member 52, the process of connecting the cathode connection member 53, and the process of connecting the metal ribbon 54 is arbitrary.

Next, the effect of the embodiment will be described.

In the light-emitting module 1 according to the embodiment, the mounting board 30 is provided with the heat radiating pads 34a and 34b in addition to the anode pad 32 and the cathode pad 33. The anode pad 32 is connected to the anode electrode of the light-emitting element 40, the cathode pad 33 is connected to the cathode electrode of the light-emitting element 40, and the anode pad 32 and the cathode pad 33 contribute to power feeding of the light-emitting element 40. On the other hand, the heat radiating pads 34a and 34b are insulated from the anode electrode and the cathode electrode of the light-emitting element 40 and do not contribute to power feeding of the light-emitting element 40. The heat radiating pads 34a and 34b are connected to the heat sink 24 via the metal ribbon 54. The heat generated in the light-emitting element 40 is discharged also through a path formed of the interconnect pattern 35, the base material 31 and the heat radiating pads 34a and 34b of the mounting board 30, the metal ribbon 54, and the heat sink 24 in addition to a path formed of the light-emitting element 40, the base material 31 and the heat sink 24, and a power feeding path of the light-emitting element 40. Thereby, the light-emitting module 1 has high heat dissipation.

In the light-emitting module 1, the metal ribbon 54 is connected between the heat radiating pads 34a and 34b and the heat sink 24. The width of the metal ribbon 54 is larger than the thickness. For this reason, compared with the wire used for normal wire bonding, the cross-sectional area orthogonal to the length direction is large, and thermal conductivity is high. Also by this, the heat dissipation of the light-emitting module 1 can be improved.

Further, in the light-emitting module 1, the anode connection member 52 and the cathode connection member 53 are also formed of the metal ribbons. Thereby, compared with the case where these connection members are formed of wires, the heat amount discharged via the anode connection member 52 and the cathode connection member 53 can be increased. Also by this, the heat dissipation of the light-emitting module 1 can be improved.

Second Embodiment

Next, the second embodiment will be described.

Figure 4:
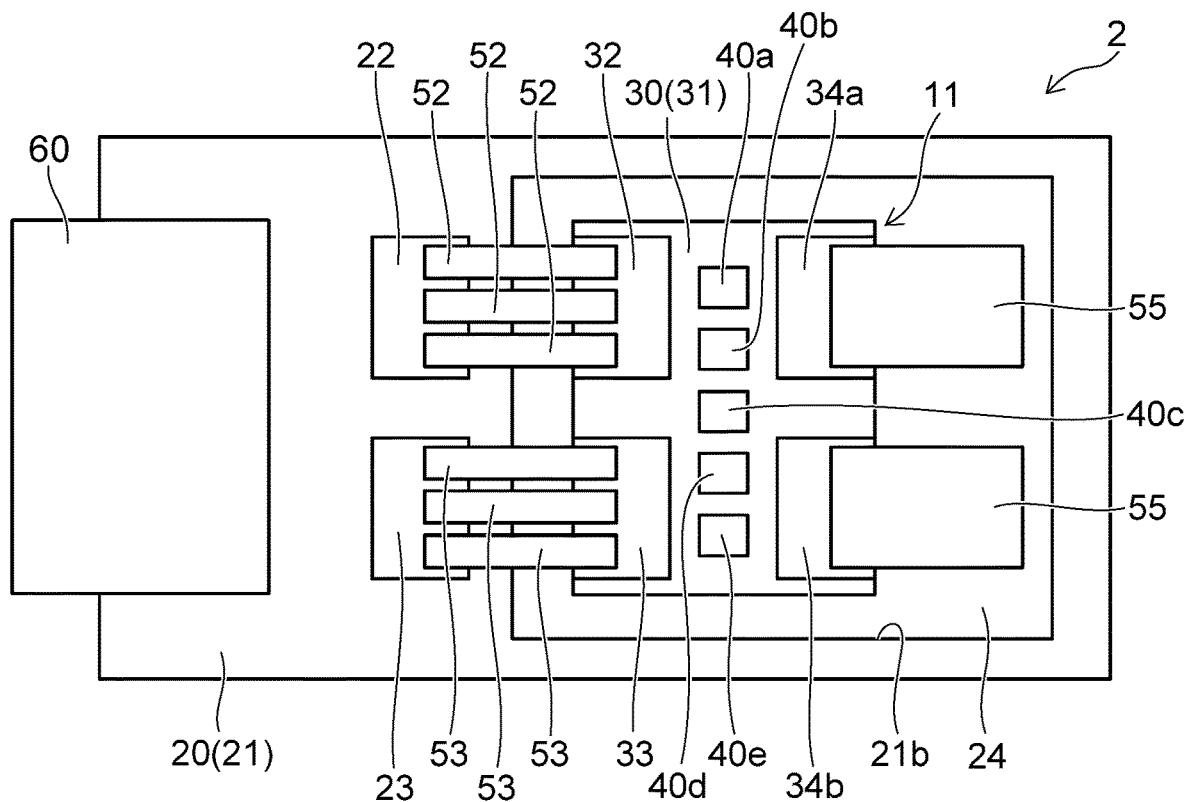
FIG. 4 is a plan view showing a light-emitting module according to a second embodiment.

FIG. 4 is a plan view showing a light-emitting module according to the embodiment.

As shown in FIG. 4, the light-emitting module 2 according to the embodiment is provided with a metal ribbon 55 instead of the metal ribbon 54 as compared with the light-emitting module 1 according to the first embodiment. The width of the metal ribbon 55 is larger than the width of the metal ribbon 54, for example, about three times the width of the metal ribbon 54, for example, 2 mm. One metal ribbon 55 is connected between the heat radiating pad 34a and the heat sink 24, and one metal ribbon 55 is also connected between the heat radiating pad 34b and the heat sink 24.

According to the embodiment, by using the metal ribbon 55 having a width wider than that of the metal ribbon 54, the number of metal ribbons can be reduced while maintaining heat dissipation. Thereby, the process of joining the metal ribbon 55 can be simplified. Thereby, the light-emitting module 2 has high productivity and low manufacturing cost.

Configurations, manufacturing methods, and effects other than the above of the embodiment are the same as those in the first embodiment.

Third Embodiment

Next, the third embodiment will be described.

Figure 5:
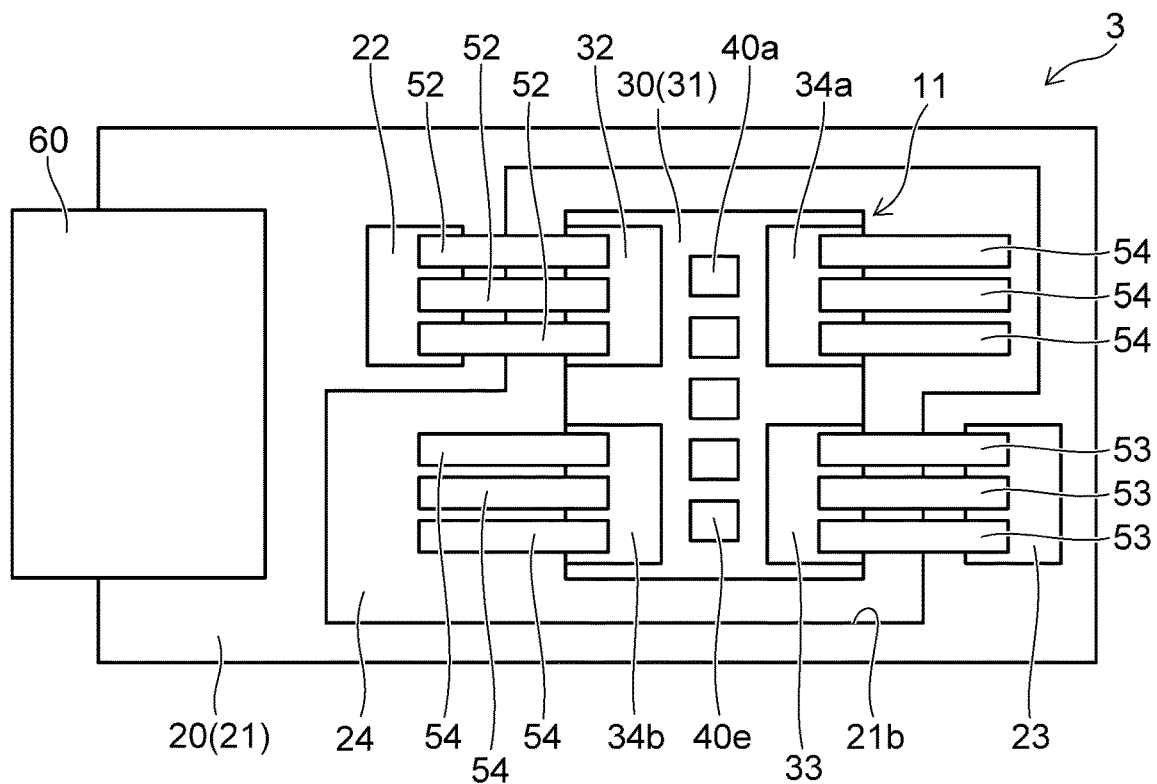
FIG. 5 is a plan view showing a light-emitting module according to a third embodiment.

FIG. 5 is a plan view showing a light-emitting module according to the embodiment.

As shown in FIG. 5, in the light-emitting module 3 according to the embodiment, the anode pad 32 and the cathode pad 33 are arranged diagonally to each other on the mounting board 30, and the heat radiating pad 34a and the heat radiating pad 34b are arranged diagonally to each other. On the module board 20, the anode terminal 22 and the cathode terminal 23 are arranged diagonally to each other. The anode connection member 52 connects the anode pad 32 and the anode terminal 22, the cathode connection member 53 connects the cathode pad 33 and the cathode terminal 23, and the metal ribbons 54 connect the heat radiating pads 34a and 34b and the heat sink 24.

In the light-emitting module 3, the heat radiating pad 34a and the heat radiating pad 34b are arranged diagonally, so that the positions where the metal ribbons 54 are connected to the heat sink 24 are dispersed. As a result, the heat flow from the light-emitting element 40 to the heat sink 24 is dispersed, and the thermal diffusion effect is high. For this reason, the light-emitting module 3 has high heat dissipation.

Configurations, manufacturing methods, and effects other than the above of the embodiment are the same as those in the first embodiment.

Fourth Embodiment

Next, the fourth embodiment will be described.

Figure 6:
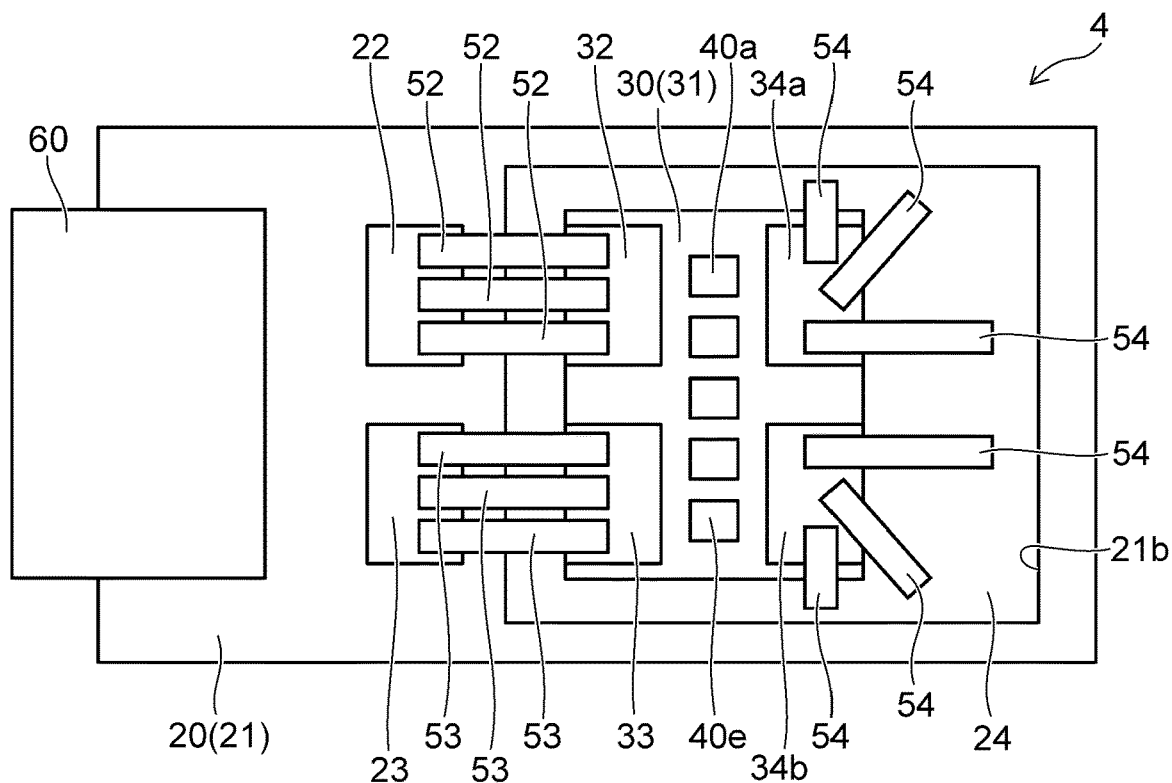
FIG. 6 is a plan view showing a light-emitting module according to a fourth embodiment.

FIG. 6 is a plan view showing a light-emitting module according to the embodiment.

As shown in FIG. 6, in the light-emitting module 4 according to the embodiment, the metal ribbons 54 are arranged radially from the heat radiating pads 34a and 34b. Thereby, the positions where the metal ribbons 54 are connected to the heat sink 24 are dispersed, and the thermal diffusion effect is improved. As a result, the light-emitting module 4 has high heat dissipation.

Configurations, manufacturing methods, and effects other than the above of the embodiment are the same as those in the first embodiment.

Fifth Embodiment

Next, the fifth embodiment will be described.

Figure 7:
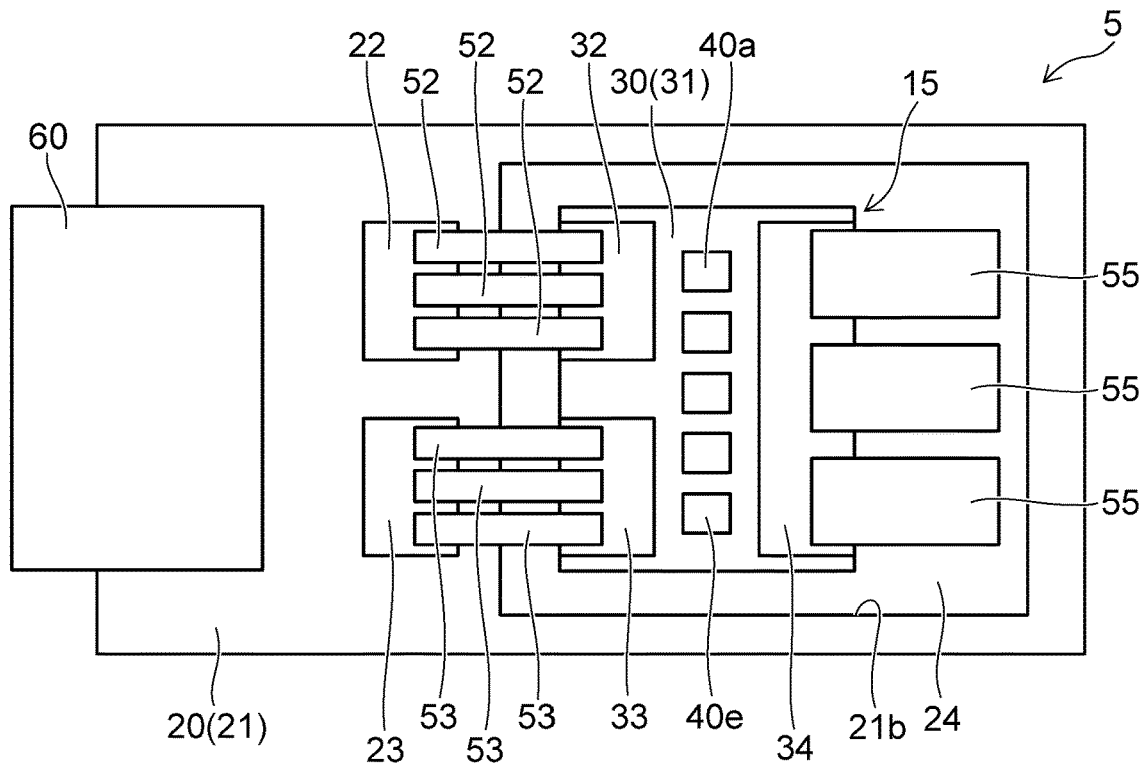
FIG. 7 is a plan view showing a light-emitting module according to a fifth embodiment.

FIG. 7 is a plan view showing a light-emitting module according to the embodiment.

As shown in FIG. 7, in the light-emitting module 5 according to the embodiment, one heat radiating pad 34 is provided in the light-emitting device 15. The heat radiating pad 34 is disposed on the opposite side of the anode pad 32 and the cathode pad 33 when viewed from the region where the light emitting-elements 40 are disposed. One or a plurality of, for example, three metal ribbons 55 are connected between the heat radiating pad 34 and the heat sink 24.

In the light-emitting module 5, one heat radiating pad 34 is disposed in the region where the two heat radiating pads 34a and 34b are disposed in the light-emitting module 1 according to the first embodiment. For this reason, there is no gap between the heat radiating pad 34a and the heat radiating pad 34b, and the entire area of the heat radiating pad 34 can be increased. Thereby, heat dissipation can be improved further. Further, since there is no gap between the heat radiating pad 34a and the heat radiating pad 34b, the metal ribbon 55 can be easily joined.

Configurations, manufacturing methods, and effects other than of the embodiment are the same as those in the first embodiment.

Sixth Embodiment

Next, the sixth embodiment will be described.

Figure 8:
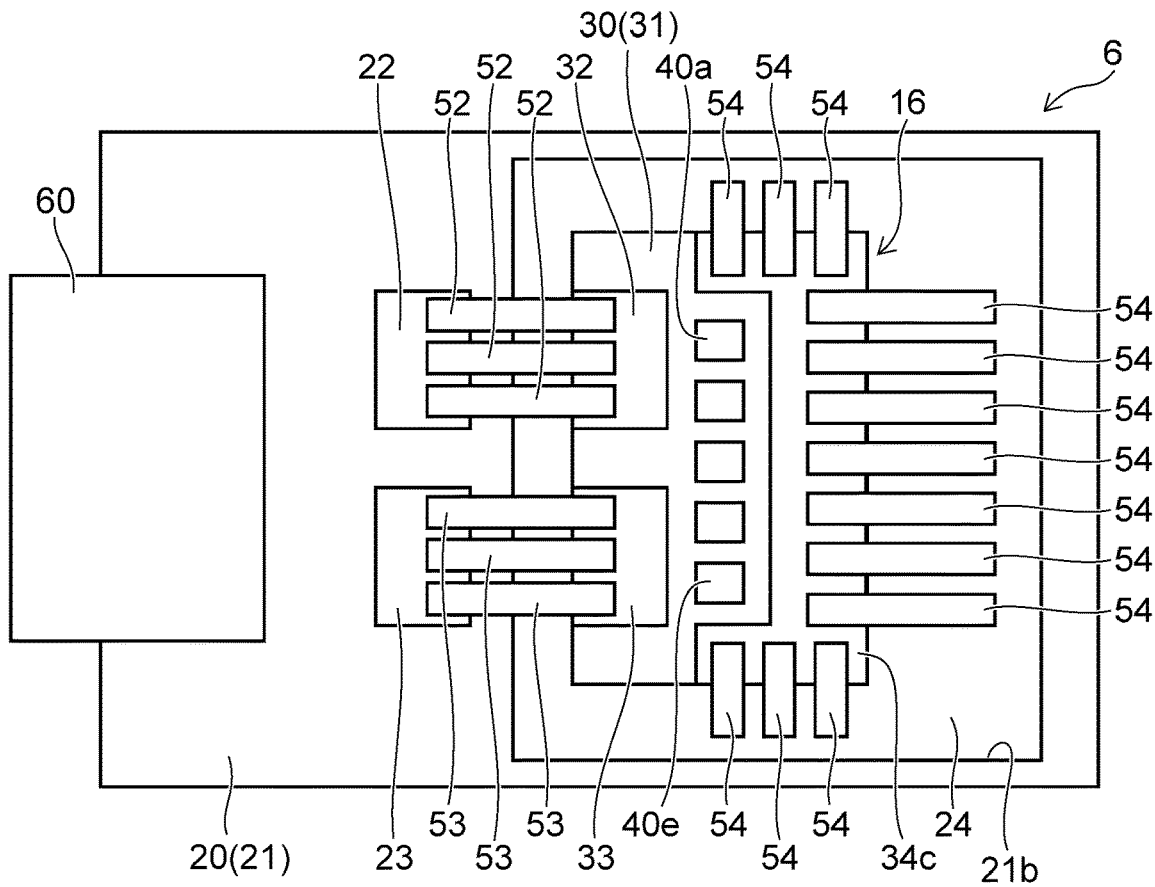
FIG. 8 is a plan view showing a light-emitting module according to a sixth embodiment.

FIG. 8 is a plan view showing a light-emitting module according to the embodiment.

As shown in FIG. 8, in the light-emitting module 6 according to the embodiment, one heat radiating pad 34c is provided in the light-emitting device 16. The heat radiating pad 34c is disposed in three directions excluding the direction in which the anode pad 32 and the cathode pad 33 are arranged when viewed from the region where the light-emitting elements 40 are disposed in a plan view. A plurality of metal ribbons 54 are connected between the heat radiating pad 34c and the heat sink 24. The plurality of metal ribbons 54 are arranged substantially radially to the light-emitting elements 40a-40e, for example.

In the light-emitting module 6, the heat radiating pad 34c is disposed so as to surround three sides of the region where the light-emitting elements 40 are disposed. Therefore, most of the heat quantity generated in the light-emitting elements 40 can flow into the heat radiating pad 34c. Further, since the heat radiating pad 34c can be formed large, many metal ribbons 54 can be connected, and the thermal conductivity between the heat radiating pad 34c and the heat sink 24 can be improved. As a result, the light-emitting module 6 has high heat dissipation.

Configurations, manufacturing methods, and effects other than the above of the embodiment are the same as those in the first embodiment.

Seventh Embodiment

Next, the seventh embodiment will be described.

Figure 9:
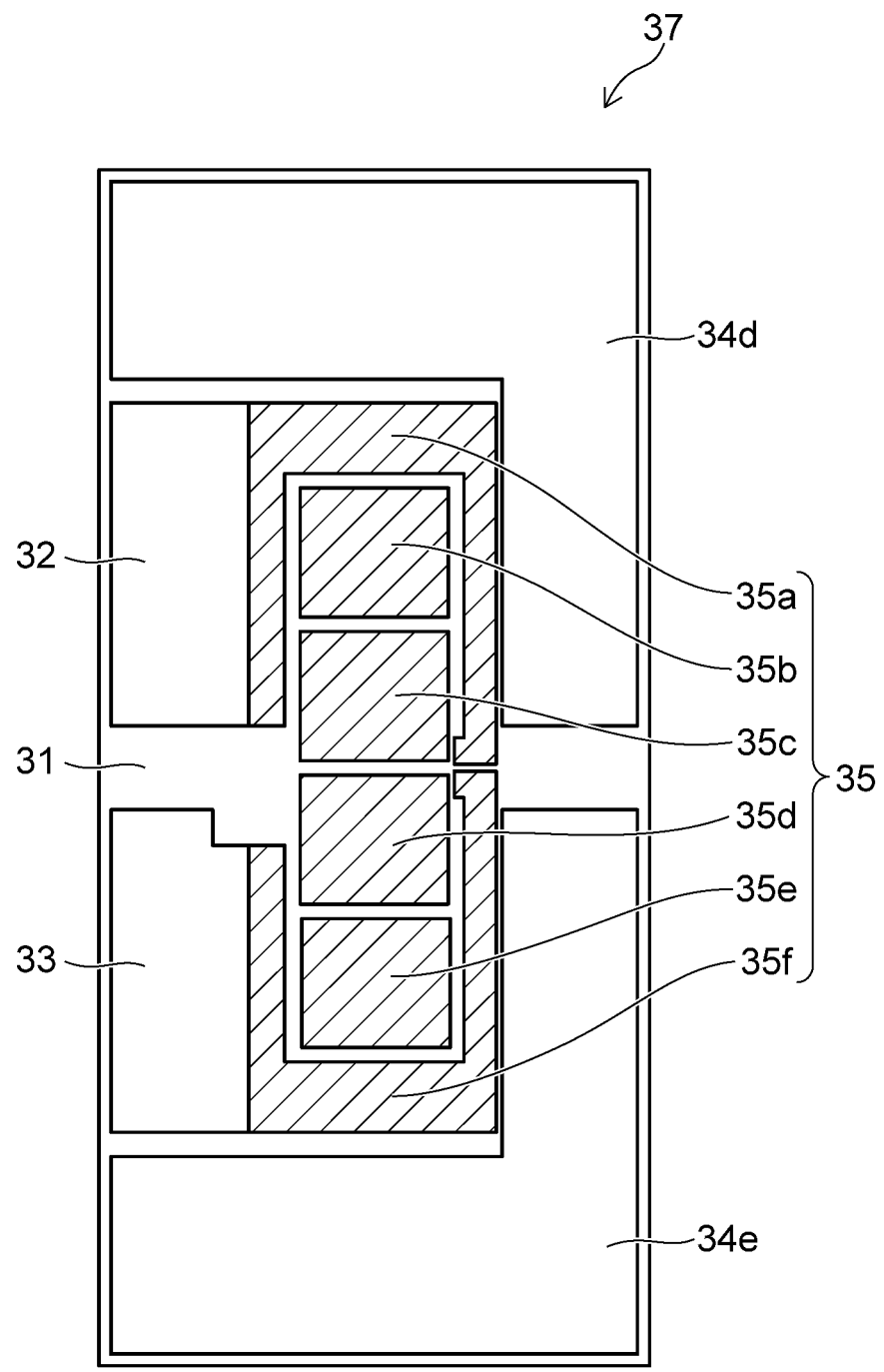
FIG. 9 is a plan view showing a mounting board in a seventh embodiment.

FIG. 9 is a plan view showing a mounting board in the embodiment.

In the light-emitting module according to the embodiment, a mounting board 37 as shown in FIG. 9 is provided. On the mounting board 37, two heat radiating pads 34d and 34e are provided. The heat radiating pad 34d is disposed in two directions when viewed from a region where the anode pad 32 and the interconnect pattern 35 are provided in a plan view. The heat radiating pad 34e is disposed in two directions when viewed from a region where the cathode pad 33 and the interconnect pattern 35 are provided in a plan view. For example, the shapes of the heat radiating pad 34d and the heat radiating pad 34e are substantially mirror images of each other. As shown in FIG. 8, the metal ribbons 54 connected to the heat radiating pads 34d and 34e may be arranged substantially radially.

According to the embodiment, since the areas of the heat radiating pads 34d and 34e can be made larger than the areas of the heat radiating pads 34a and 34b in the first embodiment, the heat dissipation can be further improved.

Configurations, manufacturing methods, and effects other than the above of the embodiment are the same as those in the first embodiment.

Eighth Embodiment

Next, the eighth embodiment will be described.

Figure 10:
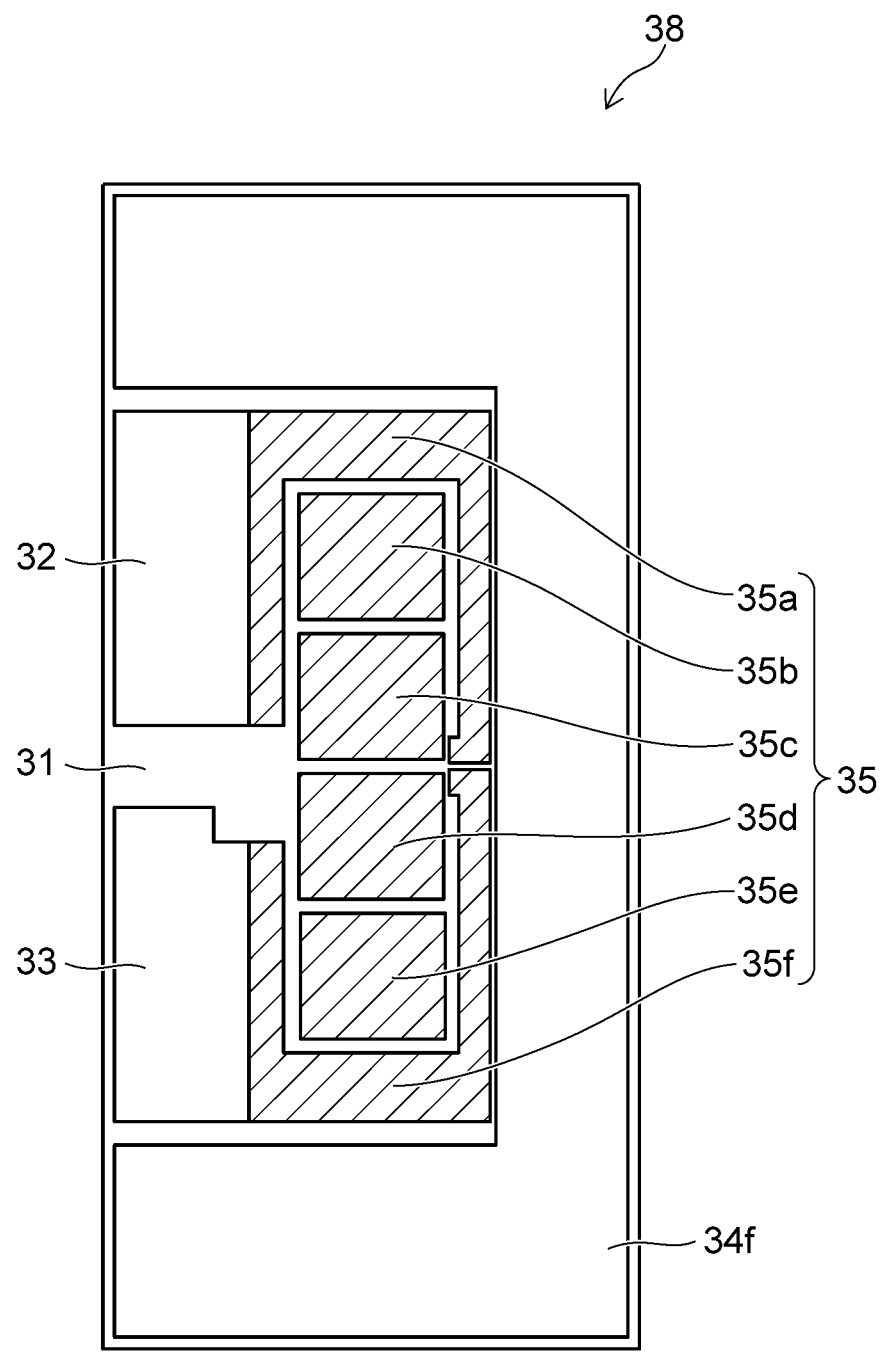
FIG. 10 is a plan view showing a mounting board in an eighth embodiment.

FIG. 10 is a plan view showing a mounting board in the embodiment.

In the light-emitting module according to the embodiment, a mounting board 38 as shown in FIG. 10 is provided. On the mounting board 38, one heat radiating pad 34f is provided. The heat radiating pad 34f is disposed so as to surround three sides of the region where the anode pad 32, the cathode pad 33, and the interconnect pattern 35 are provided in a plan view. The heat radiating pad 34f is not disposed in the direction in which the anode pad 32 and the cathode pad 33 are positioned when viewed from the region where the interconnect pattern 35 is provided. As shown in FIG. 8, the metal ribbons 54 connected to the heat radiating pads 34f may be arranged substantially radially.

In the embodiment, the heat radiating pad 34f is disposed so as to surround three sides of the region where the anode pad 32, the cathode pad 33, and the interconnect pattern 35 are disposed. Therefore, most of the heat quantity generated in the light-emitting element can flow into the heat radiating pad 34f. Moreover, since the heat radiating pad 34f can be formed large, many metal ribbons 54 can be connected. As a result, the heat dissipation of the light-emitting module can be improved.

Configurations, manufacturing methods, and effects other than the above of the embodiment are the same as those in the first embodiment.

Ninth Embodiment

Next, the ninth embodiment will be described.

Figure 11:
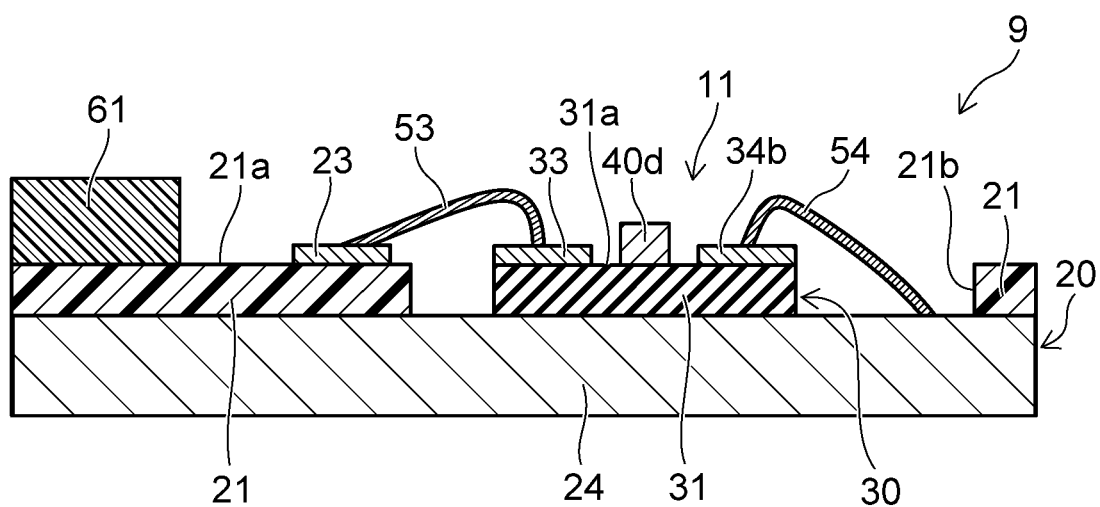
FIG. 11 is an end view showing a light-emitting module according to a ninth embodiment.

FIG. 11 is an end view showing a light-emitting module according to the embodiment.

As shown in FIG. 11, in the light-emitting module 9 according to the embodiment, a connector 61 is provided. The connector 61 is connected to the module board 20. In a plan view, the connector 61 does not protrude from the module board 20 and is disposed on the module board 20.

Configurations, manufacturing methods, and effects other than the above of the embodiment are the same as those in the first embodiment.

The embodiments described above may be practiced with combination one another.

The invention can be utilized, for example, for a headlight of vehicle, a lighting device and a light source of display device or the like.

What is claimed is:

1. A light-emitting module, comprising:
   a light-emitting element including an anode electrode and a cathode electrode;
   a mounting board including an anode pad, a cathode pad and a heat radiating pad, each of which is electrically independent, wherein the anode electrode and the anode pad are connected, and the cathode electrode and the cathode pad are connected;
   a module board including an anode terminal, a cathode terminal and a heat sink;
   an anode connection member connecting the anode pad and the anode terminal;
   a cathode connection member connecting the cathode pad and the cathode terminal; and
   a metal ribbon connecting the heat radiating pad and the heat sink.

2. The light-emitting module according to claim 1, wherein the metal ribbon is provided in a plurality.

3. The light-emitting module according to claim 2, wherein the metal ribbons are arranged in parallel one another.

4. The light-emitting module according to claim 2, wherein the metal ribbons are arranged radially with respect to the heat radiating pad.

5. The light-emitting module according to claim 1, wherein the metal ribbon has a width that is not less than 2 times and not more than 20 times the metal ribbon thickness.

6. The light-emitting module according to claim 1, wherein the metal ribbon has a thermal conductivity that is not less than 200 W/m·K and not more than 430 W/m·K.

7. A method for manufacturing a light-emitting module, comprising:
   preparing a light-emitting device, the light-emitting device including a light-emitting element including an anode electrode and a cathode electrode, and a mounting board including an anode pad, a cathode pad and a heat radiating pad, each of which is electrically independent, wherein the anode electrode and the anode pad are connected, and the cathode electrode and the cathode pad are connected;
   mounting the light-emitting device on a module board including an anode terminal, a cathode terminal, and a heat sink;
   connecting an anode connection member to the anode pad and the anode terminal;
   connecting a cathode connection member to the cathode pad and the cathode terminal; and
   connecting a metal ribbon to the heat radiating pad and the heat sink.

* * * * *